United States Patent
Kim

(10) Patent No.: US 8,174,005 B2
(45) Date of Patent: May 8, 2012

(54) ORGANIC LIGHT EMITTING DIODE LIGHTING APPARATUS

(75) Inventor: Jin-Kwang Kim, Yongin (KR)

(73) Assignee: Samsung Mobile Display Co., Ltd, Yongin, Gyunggi-do (KR)

( * ) Notice: Subject to any disclaimer, the term of this patent is extended or adjusted under 35 U.S.C. 154(b) by 126 days.

(21) Appl. No.: 12/837,176

(22) Filed: Jul. 15, 2010

(65) Prior Publication Data
US 2011/0101314 A1  May 5, 2011

(30) Foreign Application Priority Data
Nov. 4, 2009  (KR) .................. 10-2009-0106198

(51) Int. Cl.
*H01L 33/00* (2010.01)
(52) U.S. Cl. ........ 257/40; 257/88; 257/99; 257/E51.019
(58) Field of Classification Search ............. 257/40, 257/59, 88, 91, 99, 773, E23.141, E51.019
See application file for complete search history.

(56) References Cited

U.S. PATENT DOCUMENTS

| | | | |
|---|---|---|---|
| 6,709,944 B1 | 3/2004 | Durocher et al. | |
| 7,109,575 B2 * | 9/2006 | Kang et al. | 257/685 |
| 7,110,057 B2 * | 9/2006 | Jeon | 349/40 |
| 7,242,141 B2 | 7/2007 | Pschenitzka | |
| 7,642,553 B2 * | 1/2010 | Yoon et al. | 257/59 |
| 8,049,410 B2 * | 11/2011 | Suh et al. | 313/504 |
| 2008/0182352 A1 * | 7/2008 | Cho et al. | 438/30 |

FOREIGN PATENT DOCUMENTS

| | | |
|---|---|---|
| JP | 2006-040798 A | 9/2006 |
| KR | 10-2003-0026424 A | 4/2003 |
| KR | 10-2004-0024152 A | 3/2004 |
| KR | 1020050047935 A | 5/2005 |
| KR | 10-0627097 B1 | 9/2006 |
| KR | 100886902 B1 | 2/2009 |
| WO | WO 2005/004549 A1 | 1/2005 |

\* cited by examiner

*Primary Examiner* — Tuan N. Quach
(74) *Attorney, Agent, or Firm* — Knobbe Martens Olson & Bear LLP

(57) ABSTRACT

An organic light emitting diode lighting apparatus is disclosed. The apparatus includes a plurality of electrode lines that feed current to or from a plurality of light emitting diodes, and a flexible printed circuit board (FPCB) that has a plurality of connection lines electrically connected to the plurality of electrode lines through the plurality of contact holes. In some embodiments, the FPCB has a fuse for each of the electrode lines.

19 Claims, 5 Drawing Sheets

ORGANIC LIGHT EMITTING DIODE LIGHTING APPARATUS

CROSS-REFERENCE TO RELATED APPLICATIONS

This application claims priority to and the benefit of Korean Patent Application No. 10-2009-0106198 filed in the Korean Intellectual Property Office on Nov. 4, 2009, the entire content of which is incorporated herein by reference.

BACKGROUND

1. Field

The described technology relates generally to a lighting apparatus, and more specifically, to an organic light emitting diode lighting apparatus using an organic light emitting diode.

2. Description of the Related Technology

An organic light emitting diode (OLED) includes a hole injection electrode, an organic emission layer, and an electron injection electrode. An organic light emitting diode emits light by energy generated when excitons generated by combining electrons and holes inside an organic emission layer fall to a ground state.

The organic light emitting diode lighting apparatus is a lighting apparatus using an organic light emitting diode, which is a surface light source. The organic light emitting diode lighting apparatus has been widely used for various purposes due to inherent advantages of the surface light source.

Generally, when the organic light emitting diode lighting apparatus emits one color of light, the entire current supplied to the organic light emitting diode through a single wire can be controlled. On the other hand, when the organic light emitting diode lighting apparatus should emit various colors of light and control luminance for each color component, the apparatus should use multiple wires that supply different power to cells of each color.

However, when the organic light emitting diode lighting apparatus uses multiple wires, its structure is complicated by space limitations and a more readily occurring voltage drop (IR-drop).

In addition, when the organic light emitting diode reaches the end of its operational life-span or is in a poorly functioning state, the amount of current increases. As a result of this process, through a positive feedback mechanism, the organic light emitting diode comes to be in an approximate short state. As a consequence, when one area of the organic light emitting diode is in a short state, most of the available current is concentrated in the one area. Accordingly, other areas do not get sufficient current and poor image quality affects organic light emitting diodes.

The above information disclosed in this Background section is only for enhancement of understanding of the background of the described technology and therefore it may contain information that does not form the prior art that is already known in this country to a person of ordinary skill in art.

SUMMARY OF CERTAIN INVENTIVE ASPECTS

One aspect is an organic light emitting diode lighting apparatus. The apparatus includes a substrate main body including a light emitting area and a pad area, a plurality of electrode lines that are formed on the substrate main body, at least one organic emission layer that is formed on the plurality of electrode lines in the light emitting area, a common electrode that is formed on the organic emission layer, and a pad insulation layer covering the plurality of electrode lines, where the pad insulation layer has a plurality of contact holes that expose a part of each of the plurality of electrode lines in the pad area. The apparatus also includes a flexible printed circuit board (FPCB) that includes a plurality of connection lines electrically connected to the plurality of electrode lines through the plurality of contact holes.

DETAILED DESCRIPTION OF CERTAIN INVENTIVE EMBODIMENTS

Figure 1:
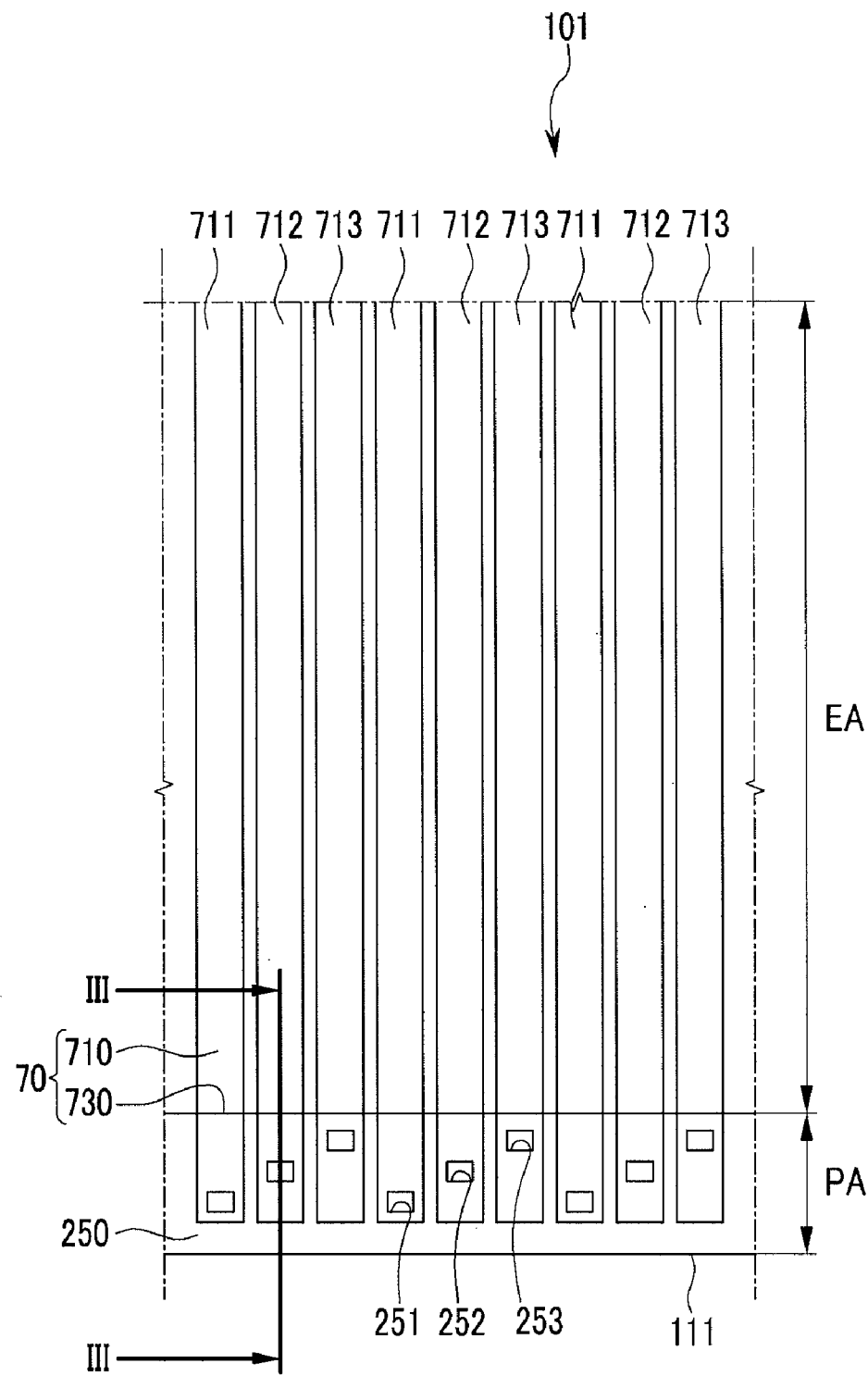
FIG. 1 is a partial layout view of an organic light emitting diode lighting apparatus according to an exemplary embodiment.

In the following detailed description, only certain exemplary embodiments have been shown and described, simply by way of illustration. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification.

In addition, the size and thickness of each component shown in the drawings are shown for better understanding and ease of description, but the present invention is not limited thereto.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

Hereinafter, various aspects of exemplary embodiments will be described with reference to FIGS. 1 to 3.

Figure 2:
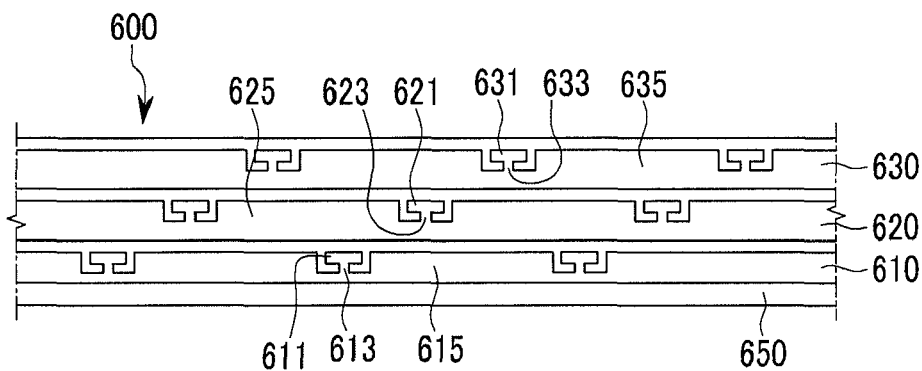
FIG. 2 is a partial layout view of a flexible printed circuit board used for the organic light emitting diode (OLED) display of FIG. 1.
Figure 3:
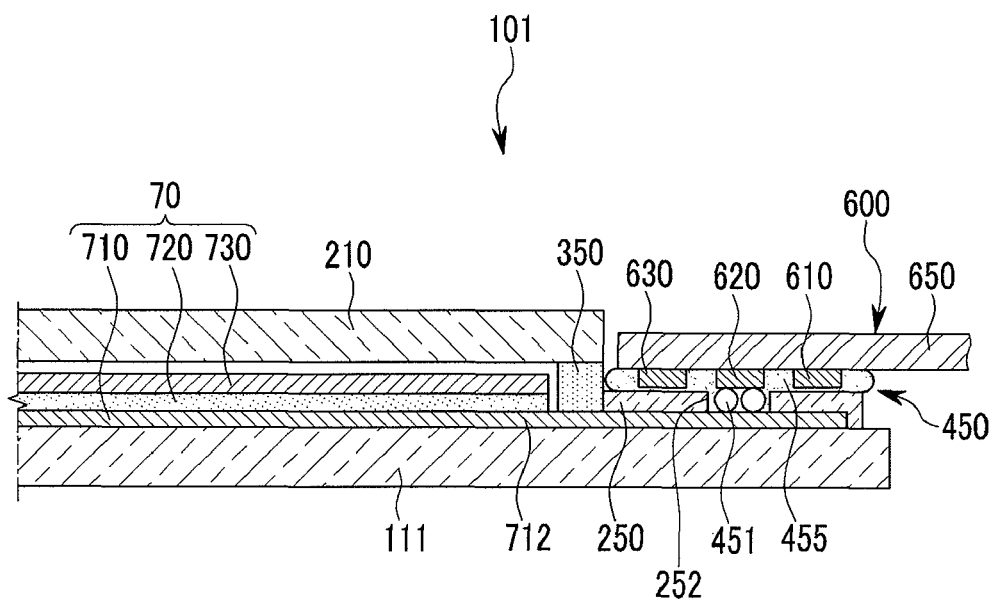
FIG. 3 is a cross-sectional view taken along line III-III of FIG. 1.

As shown in FIGS. 1 to 3, an organic light emitting diode lighting apparatus 101 according to an exemplary embodiment includes a substrate main body 111, a plurality of electrode lines 710, an organic emission layer 720, a common electrode 730, a pad insulation layer 250, and a flexible printed circuit board (FPCB) 600. Herein, the plurality of line electrodes 710, the organic emission layer 720, and the common electrode 730 are part of an organic light emitting diode (OLED) 70. In addition, the organic light emitting diode lighting apparatus 101 further includes a sealing member 210.

The substrate main body 111 is formed of an insulating substrate made of glass, quartz, ceramic, plastic, etc. However, the present invention is not limited thereto, and the substrate main body 111 may be formed of various materials that are known to those skilled in the art. Further, the substrate main body 111 is divided into a light emitting area (EA) and a pad area (PA).

The plurality of electrode lines 710 are formed in a stripe pattern on the substrate main body 111. The plurality of electrode lines 710 are formed over both the light emitting area (EA) and the pad area (PA) on the substrate main body 111. In other words, the plurality of electrode lines 710 are formed to extend from the light emitting area (EA) to the pad area (PA) on the substrate main body 111.

In addition, the plurality of electrode lines 710 can be divided into a plurality of electrode groups 711, 712, and 713. In FIG. 1, the plurality of electrode lines 710 are divided into three electrode groups that include a first electrode group 711, a second electrode group 712, and a third electrode group 713. However, other embodiments are not limited thereto.

The plurality of electrode lines 710 are formed of a metallic material or a transparent conductive material. For example, the metallic material may include lithium (Li), calcium (Ca), lithium fluoride/calcium (LiF/Ca), lithium fluoride/aluminum (LiF/Al), aluminum (Al), silver (Ag), magnesium (Mg), gold (Au), etc. In addition, the transparent conductive material may include indium tin oxide (ITO), indium zinc oxide (IZO), zinc oxide (ZnO), indium oxide (In$_2$O$_3$), etc.

The direction of light emitted from the organic light emitting diode lighting apparatus 101 depends on the materials of the plurality of electrode lines 710. In addition, in some embodiments, where the plurality of electrode lines 710 are formed of a transparent conductive material, the organic light emitting diode lighting apparatus 101 may further include an auxiliary electrode (not shown) that is formed of a metallic material. The auxiliary electrode (not shown) supplements conductivity of the electrode lines 710 because the transparent conductive material may have a relatively large sheet resistance of the electrode line 710.

Moreover, the plurality of electrode lines 710 have a thickness of approximately 100 nm to 200 nm, and are formed through a deposition process.

In addition, in the exemplary embodiment, the plurality of electrode lines 710 are hole injection electrodes. In other words, the plurality of electrode lines 710 are anodes of the organic light emitting diodes 70.

The organic emission layer 720 is formed on the plurality of line electrodes 710 in the light emitting area (EA) on the substrate main body 111. The organic emission layer 720 can emit a single color of light or various colors. When the organic emission layer 720 emits various colors of light, the organic emission layer 720 that is formed on the plurality of electrode lines 710 emits different a color of light for each electrode group 711, 712, and 713. In some embodiments, the organic emission layer 720 has a separate layer for each of the colors. In other words, the organic emission layer 720 that is formed on the electrode lines 710 emits different colors of light. For example, the organic emission layer 720 that is formed on the first electrode group 711 emits red-based light, the organic emission layer 720 that is formed on the second electrode group 712 emits green-based light, and the organic emission layer 720 that is formed on the third electrode group 713 emits blue-based light. However, embodiments are not limited thereto. For example, if the plurality of electrode lines 720 are divided into two electrode groups, the organic emission layer 720 can emit bluish-green-based and orange-based light. In addition to this, the organic emission layer 720 can emit various colors of light.

As described above, an organic light emitting diode lighting apparatus 101 according to an exemplary embodiment can emit various colors of light according to the plurality of divided electrode lines 710 and the organic emission layer 720, and can control luminance for each component.

In addition, the organic emission layer 720 is made of a low molecular weight organic material or a high molecular weight organic material. The organic emission layer 720 may have a multilayer structure, including at least one of an emission layer, a hole-injection layer (HIL), a hole-transporting layer (HTL), an electron-transporting layer (ETL), and an electron-injection layer (EIL). When the organic emission layer 720 includes these layers, the hole-injection layer (HIL) is disposed on the electrode line 710 that is an anode, and the hole transport layer (HTL), the emission layer, the electron transport layer (ETL), and the electron injection layer (EIL) are sequentially stacked on the hole-injection layer.

The common electrode 730 is formed on the organic emission layer 720. The common electrode 730 is an electron injection electrode. That is, the common electrode 730 is a cathode electrode of the organic light emitting diode 70.

In addition, the common electrode 730 is formed of a metallic material or a transparent conductive material. At least one of the electrode line 710 and the common electrode 730 should be formed of the transparent conductive material.

As shown in FIG. 3, a sealing member 210 covers the light emitting area (EA) of the substrate main body 111 to protect the organic emission layer 720.

The sealing member 210 may be formed of an insulating substrate made of glass, quartz, ceramic, plastic, etc., or of a metallic substrate made of stainless steel, etc. The sealing member 210 and is sealed to the substrate main body 111 with a sealant 350.

Moreover, the sealing member 210 may be formed of at least one organic layer or inorganic layer, or may be formed of a sealing thin film comprising at least one inorganic layer and at least one organic layer.

The pad insulation layer 250 covers the plurality of electrode lines 710 in the pad area on the substrate main body 111. The pad insulation layer 250 has a plurality of contact holes 251, 252, and 253 each of which exposes a part of one of the plurality of electrode lines 710.

The contact holes 251, 252, and 253 that expose the electrode lines 710 belonging to the same electrode groups 711, 712, and 713 are formed at the same distance from the light emitting area (EA). In addition, the contact holes 251, 252, and 253 that expose the electrode lines 710 belonging to different electrode groups 711, 712, and 713 are formed at different distances from the light emitting area (EA).

In detail, the contact holes include first contact holes 251, a second contact holes 252, and a third contact holes 253. The first contact holes 251 expose the electrode lines 710 that belong to the first electrode group 711. The second contact holes 252 expose the electrode lines 710 that belong to the second electrode group 712. The third contact holes 253 expose the electrode lines 710 that belong to the third electrode group 713. The first contact holes 251, the second contact holes 252, and the third contact holes 253 are formed at different positions, that is, at different distances from the light emitting area (EA).

In addition, the pad insulation layer 250 may be formed of various insulation layers known to those skilled in the art, such as silicon nitride, silicon oxide, etc.

As shown in FIG. 2, the flexible printed circuit board 600 includes a base substrate 650 and a plurality of connection lines 610, 620, and 630 that are formed on the base substrate 650. Although not shown, the flexible printed circuit board 600 may further include various elements and other wires that are mounted on the base substrate 650.

The plurality of connection lines 610, 620, and 630 are electrically connected to the plurality of electrode lines 710 through the plurality of contact holes 251, 252, and 253. The plurality of connection lines 610, 620, and 630 are formed in a direction intersecting the plurality of electrode lines 710. The connection lines 610, 620, and 630 are respectively connected to the electrode lines of electrode groups 711, 712, and 713 through the contact holes 251, 252, and 253, respectively. In detail, the plurality of connection lines include a first connection line 610, a second connection line 620, and a third connection line 630. The first connection line 610 is connected to the electrode line 710 belonging to the first electrode group 711 through the first contact hole 251. The second connection line 620 is connected to the electrode line 710 belonging to the second electrode group 712 through the second contact hole 252. The third connection line 630 is connected to the electrode line 730 belonging to the third electrode group 713 through the third contact hole 253.

In addition, the plurality of connection lines 610, 620, and 630 are formed of a metal layer such as copper (Cu), aluminum (Al), etc. The plurality of connection lines 610, 620, and 630 are thicker than the plurality of electrode lines 710. Therefore, the plurality of connection lines 610, 620, and 630 have relatively very low specific resistance. For example, the plurality of connection lines 610, 620, and 630 may have a thickness in the range of about 0.5 µm to about 50 µm. As described above, the connection lines 610, 620, and 630 preferably have a thickness of about 0.5 µn, which provides sufficiently low resistance for some embodiments. However, in some embodiments, the thickness of the connection lines 610, 620, and 630 may be greater than about 50 µm. However, in some embodiments, the greater thickness is unnecessary.

In some embodiments, the plurality of connection lines 610, 620, and 630 can be formed in a relatively simple manner through a plating process.

As described above, current is supplied to the organic light emitting diodes 70 through the plurality of connection lines 610, 620, and 630 that are formed on the flexible printed circuit board 600 and have excellent electrical characteristics. As a result, poor performance characteristics, such as excessive voltage drop (IR-drop), can be avoided.

The plurality of connection lines 610, 620, and 630 respectively include line units 615, 625, and 635, connection units 611, 621, and 631 spaced from the line units 615, 625, and 635, and fuse units 613, 623, and 633 that connect the line units 615, 625, and 635 with the connection units 611, 621, and 631. The connection units 611, 621, and 631 are electrically connected to the plurality of electrode lines 710 through the plurality of contact holes 251, 252, and 253.

Figure 4:
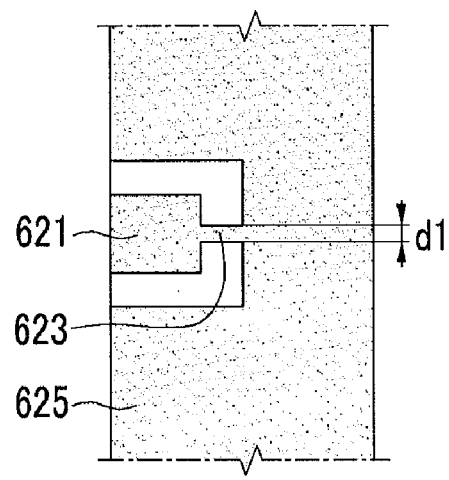
FIG. 4 is an enlarged layout view showing a connection line of FIG. 2.

FIG. 4 is an enlarged layout view showing the second connection line 620. As shown in FIG. 4, the fuse unit 623 has a line width d1, which is in the range of about 50 µm to about 100 µm. In order to cause the organic light emitting diode 70 to emit light, current flowing through the fuse unit 623 is, for example, approximately 200 mA. The fuse unit 623 interrupts current by disconnecting when the current amount flowing to the organic light emitting diode 70 is excessively large. When the organic light emitting diode 70 is normally operated, if an excessively large amount of current flows, the line width d1 of the fuse unit 623 is set to be disconnected.

As described above, since the connection lines 610, 620, and 630 have the fuse units 613, 623, and 633, if a defect occurs in a part of the organic light emitting diode 70, the fuse units 613, 623, and 633 of the connection lines 610, 620, and 630 connected to the electrode line 710 of the corresponding organic light emitting diodes 70 are disconnected, thereby preventing the defects from spreading to all organic light emitting diodes 70.

Figure 5:
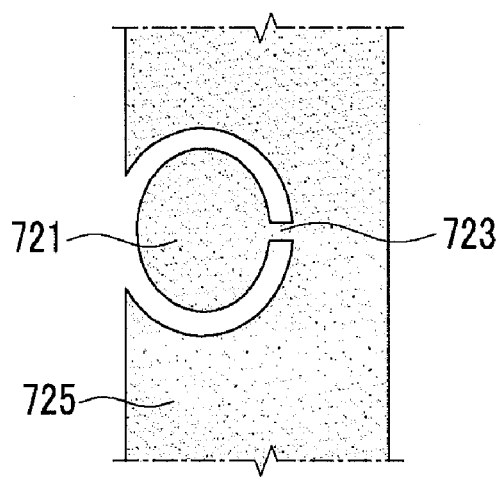
FIGS. 5 to 7 are enlarged layout views of a connection line according to various embodiments.
Figure 6:
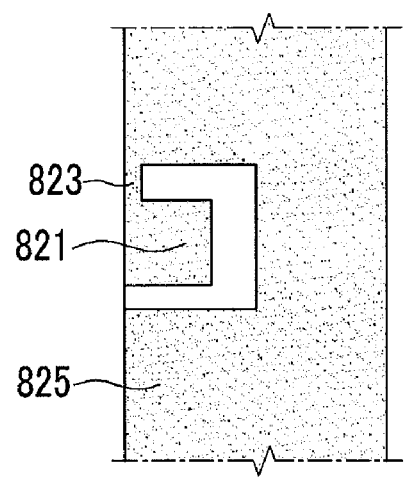

In FIGS. 2 and 4, the connection unit 621 is formed in a polygonal shape such as a quadrangle. However, embodiments are not limited thereto. Therefore, as shown in FIG. 5, the connection unit 721 may be formed in a circular or oval shape. In FIG. 5, reference numerals 723 and 725 indicate the fuse unit and the line unit. Further, as shown in FIG. 6, the fuse unit 823 may be formed in parallel with the length direction of the line unit 825. In FIG. 6, reference numeral 821 indicates a connection unit.

Figure 7:
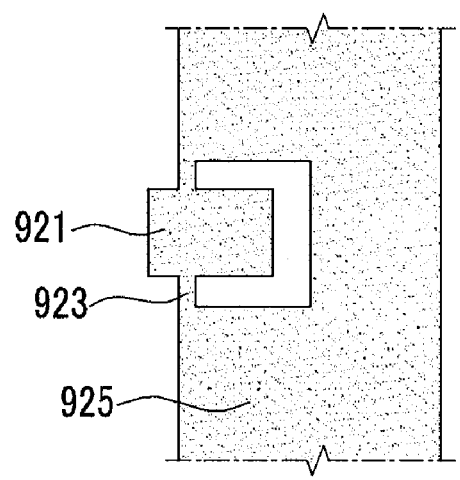

Also, as shown in FIG. 7, there may be two or more fuse units 923 connected to one connection unit 921. In FIG. 7, reference numeral 925 indicates a line unit.

As described above, FIGS. 5 to 7 show the connection units 721, 821, and 921 and the fuse units 723, 823, and 923, respectively, according to various embodiments.

In addition, the organic light emitting diode lighting apparatus 101 may use an anisotropic conductive film (ACF) 450 that effectively connects a connection line of the flexible printed circuit board 600 to an electrode line 710 of the organic light emitting diode 70. The anisotropic conductive film 450 includes an adhesive layer 455 and conductive balls 451 that are mixed in the adhesive layer. The conductive balls 451 of the anisotropic conductive film 450 perform a role of electrically connecting the electrode line to the connection line.

However, embodiments are not limited thereto, and the anisotropic conductive film can be omitted. The electrode line 710 and the connection lines 610, 620, and 630 can be connected by various methods known to those skilled in the art.

The organic light emitting diode lighting apparatus according to the exemplary embodiments can suppress a voltage drop while effectively emitting various colors of light or controlling luminance for each component.

In addition, the organic light emitting diode lighting apparatus 101 can prevent the spread of defects caused by a short.

Figure 8:
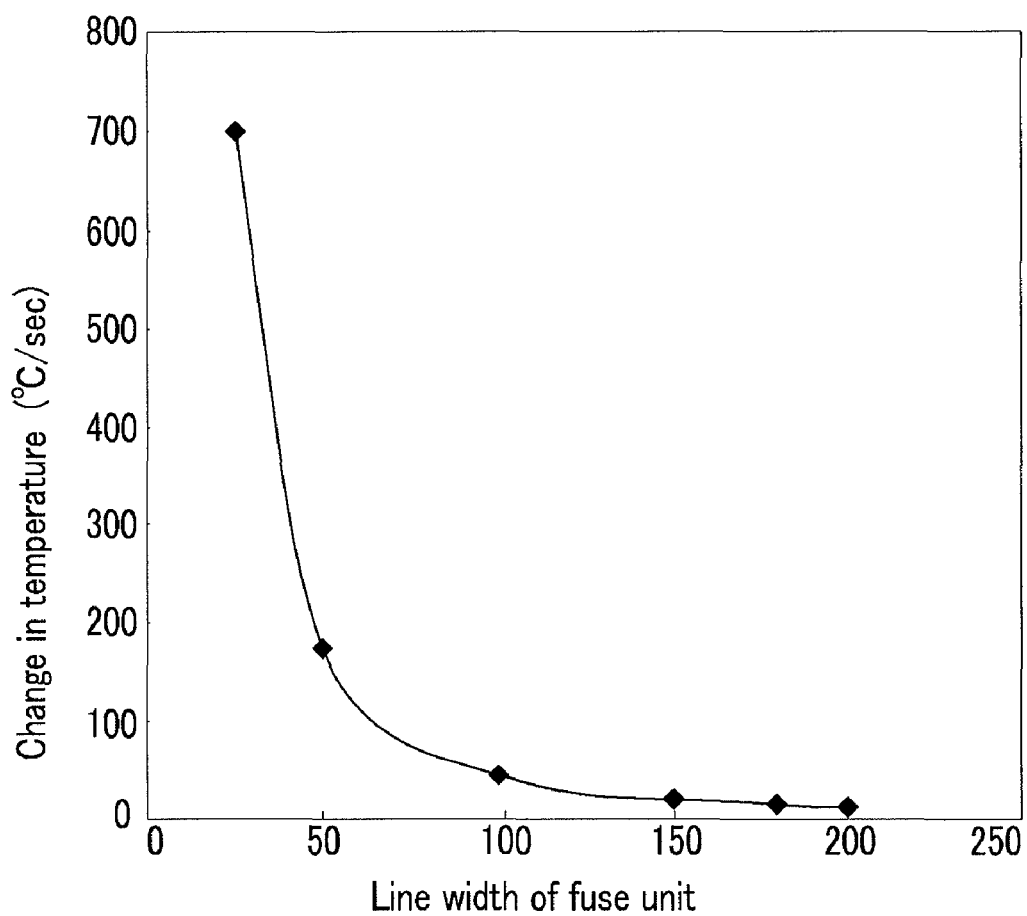
FIG. 8 is a graph showing line width of a fuse unit vs. a change in temperature of an experimental example according to an exemplary embodiment.

Hereinafter, an experimental example according to some embodiments will be described with reference to FIG. 8. FIG. 8 is a graph showing the line width of the fuse unit vs. a change in temperature for the exemplary embodiment. In the experimental example, the connection line including the fuse unit is formed of aluminum and has a thickness of about 10 µm.

As shown in FIG. 8, when the line width of the fuse unit is larger than about 100 µm, the change in temperature is small, such that it is difficult to blow the fuse to open the circuit. On the other hand, when the line width of the fuse unit is smaller than about 50 µm, the disconnection occurs too easily. Therefore, it can be appreciated that an optimum line width of the fuse unit is in the range of about 50 µm to about 100 µm.

While various aspects of embodiments have been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode lighting apparatus, comprising:
   a substrate main body including a light emitting area and a pad area;
   a plurality of electrode lines that are formed on the substrate main body;
   at least one organic emission layer that is formed on the plurality of electrode lines in the light emitting area;

a common electrode that is formed on the organic emission layer;

a pad insulation layer covering the plurality of electrode lines, wherein the pad insulation layer has a plurality of contact holes that expose a part of each of the plurality of electrode lines in the pad area; and a flexible printed circuit board (FPCB) that includes a plurality of connection lines electrically connected to the plurality of electrode lines through the plurality of contact holes.

2. The organic light emitting diode lighting apparatus of claim 1, wherein the plurality of electrode lines are divided into a plurality of electrode line groups.

3. The organic light emitting diode lighting apparatus of claim 2, wherein contact holes that expose the electrode lines belonging to the same electrode line group are formed at substantially the same distance from the light emitting area.

4. The organic light emitting diode lighting apparatus of claim 2, wherein contact holes that expose the electrode lines belonging to different electrode line groups are formed at different distances from the light emitting area.

5. The organic light emitting diode lighting apparatus of claim 2, wherein the organic emission layer emits at least one color of light.

6. The organic light emitting diode lighting apparatus of claim 5, wherein the organic emission layer formed on the electrode lines belonging to different electrode line groups emits different colors of light.

7. The organic light emitting diode lighting apparatus of claim 6, wherein the organic emission layer emits red-based, green-based, and blue-based light.

8. The organic light emitting diode lighting apparatus of claim 6, wherein the organic emission layer emits bluish-green-based light and orange-based light.

9. The organic light emitting diode lighting apparatus of claim 2, wherein the plurality of connection lines are formed in a direction intersecting the plurality of electrode lines.

10. The organic light emitting diode lighting apparatus of claim 9, wherein one connection line of the plurality of connection lines is connected to electrode lines that belong to one of the plurality of electrode line groups.

11. The organic light emitting diode lighting apparatus of claim 9, wherein the plurality of connection lines are formed of a metal film and have a thickness in the range of about 0.5 µm to about 50 µm.

12. The organic light emitting diode lighting apparatus of claim 11, wherein the plurality of electrode lines are formed through a deposition process, and the plurality of connection lines are formed through a plating process.

13. The organic light emitting diode lighting apparatus of claim 1, further comprising:

a sealing member that covers the light emitting area on the substrate main body.

14. The organic light emitting diode lighting apparatus of claim 1, wherein each of the plurality of connection units includes a line unit, a connection unit spaced from the line unit, and a fuse unit that connects the line unit with the connection unit.

15. The organic light emitting diode lighting apparatus of claim 14, wherein the connection unit is electrically connected to one of the plurality of electrode lines through one of the plurality of contact holes.

16. The organic light emitting diode lighting apparatus of claim 15, wherein the fuse unit has a line width in the range of about 50 µm to about 100 µm.

17. The organic light emitting diode lighting apparatus of claim 15, wherein two or more fuse units are connected to one connection unit.

18. The organic light emitting diode lighting apparatus of claim 15, wherein the connection unit is formed in a polygonal shape.

19. The organic light emitting diode lighting apparatus of claim 15, wherein the connection unit is formed in a circular or oval shape.

* * * * *